United States Patent [19]

Holstead et al.

[11] 3,984,250

[45] Oct. 5, 1976

[54] LIGHT-SENSITIVE DIAZOKETONE AND AZIDE COMPOSITIONS AND PHOTOGRAPHIC ELEMENTS

[75] Inventors: Colin Holstead, Abbotts Langley, England; Wojciech Maria Przezdziecki, Pittsford, N.Y.; Hans M. Wagner, Pinner, England

[73] Assignee: Eastman Kodak Company, Rochester, N.Y.

[22] Filed: Feb. 9, 1971

[21] Appl. No.: 114,058

[30] Foreign Application Priority Data

Feb. 12, 1970 United Kingdom................. 6846/70

[52] U.S. Cl................................. 96/115 R; 96/33; 96/35; 96/36; 96/36.3; 96/75; 96/91 D; 96/91 N; 260/141; 260/349
[51] Int. Cl.²...................... G03C 1/54; G03C 1/72
[58] Field of Search............. 96/91 N, 91 D, 75, 33, 96/115 R, 115 P, 36, 36.3; 260/141, 349

[56] References Cited

UNITED STATES PATENTS

| 2,690,968 | 10/1954 | Powers............................ 96/91 N X |
|---|---|---|
| 3,046,110 | 7/1962 | Schmidt............................ 96/91 D |
| 3,046,113 | 7/1962 | Schmidt et al.................. 96/91 D X |
| 3,092,494 | 6/1963 | Sus et al. .......................... 96/91 N |
| 3,130,049 | 4/1964 | Neugebauer et al.............. 96/91 D |
| 3,143,423 | 8/1964 | Reynolds et al. ................ 96/91 N |
| 3,467,518 | 9/1969 | Laridon et al. ................... 96/91 N |
| 3,495,979 | 2/1970 | Laridon et al..................... 96/91 D |
| 3,526,503 | 9/1970 | Dunham et al..................... 96/91 D |
| 3,573,917 | 4/1971 | Okamoto............................ 96/91 D |
| 3,617,271 | 11/1971 | Poot et al. ......................... 260/141 |
| 3,617,278 | 3/1968 | Holstead et al.................... 260/349 |

FOREIGN PATENTS OR APPLICATIONS 900,172   7/1949   Germany ........................... 96/91 D Primary Examiner—Charles L. Bowers, Jr.
Attorney, Agent, or Firm—J. J. Ruch

[57] ABSTRACT

Light-sensitive compositions including a polymer of the type that is reactable with an azide sensitizer when exposed to light and a sensitizing amount of a naphthalene sensitizer having ortho diazo and oxo substituents at the 1,2 or the 2,1 positions of the naphthalene nucleus and further having an azidosulfonyl substituent group of which the sulfonyl moiety is bonded directly to the naphthalene nucleus at the 4 or the 5-position, are advantageous in the preparation of positive-working photolithographic materials. In the azidosulfonyl group, the azido moiety can be linked directly or indirectly to the sulfonyl moiety, such as in the compounds 2-diazo-1,2-dihydro-1-oxo-5(4'-azidophenoxysulfonyl)naphthalene and 5-azidosulfonyl-2-diazo-1,2-dihydro-1-oxonaphthalene. The light-sensitive compositions can be coated on support materials to prepare composite photographic elements having utility as photolithographic printing masters and photoresists for etching operations.

6 Claims, No Drawings

LIGHT-SENSITIVE DIAZOKETONE AND AZIDE COMPOSITIONS AND PHOTOGRAPHIC ELEMENTS

This invention relates to photography and more particularly to light-sensitive compositions and photographic elements including a polymer sensitized with naphthalene compounds substituted with both ortho diazoketone groups and with an azidosulfonyl group.

The technology of photopolymerization or photocrosslinking of preformed polymers is well known. Generally, monomeric or polymeric constituents are admixed with an effective amount of a reactive sensitizer compound such that, on exposure to activating radiation, polymerization or crosslinking occurs in imagewise exposed regions. A wide variety of suitable sensitizers are known and include, for example, ketone type and arylazide sensitizers. Such compositions tend to produce an insolubilized polymer image in exposed regions, the polymer image being ink receptive and resistant to etchant baths. Accordingly, the compositions are useful in photolithography and photoresist applications, such as in the preparation of printed circuits.

The above compositions are negative-working, however, and produce image in areas of exposure. For reasons including those of versatility, it has been desirable to provide positive-working sensitized polymer compositions wherein the image corresponds to unexposed regions. Accordingly, it has been known to provide alkali soluble resins that have been made additionally soluble by the photo-induced attachment of solubilizing groups, such as is described in British Pat. No. 1,116,674. Positive-working compositions using initially alkali soluble polymers, however, suffer from certain disadvantages. Firstly, after-treatments to insure an adequate differential in hydrophobicity-hydrophilicity between image and non-image areas are often required. Secondly, since both image and non-image areas are alkali soluble, although to a lesser and greater degree, development can cause removal or degradation of image areas.

Accordingly, it is an advantage to provide positive-working compositions using polymers that are substantially alkali insoluble since they provide increased hydrophobicity and solvent resistance in exposed areas. Exemplary such compositions are described, for example, in Canadian Pat. No. 837,083, and related French Pat. No. 1,589,401 and German Pat. No. 1,772,100. The range of available sensitizers for positive working compositions using substantially alkali insoluble polymers is rather limited, however, and it would be desirable to provide additional sensitizers that have utility in such light-sensitive compositions.

Accordingly, it is an object of this invention to provide new sensitizers that can be used, in combination with substantially alkali insoluble polymers, to prepare positive-working light-sensitive compositions.

It is another object of the present invention to provide new azidosulfonyl substituted diazoketone sensitizers that are useful in conjunction with substantially alkali insoluble polymers in the preparation of positive-working light-sensitive compositions.

Still another object of the present invention is to provide novel light-sensitive compositions that include a substantially alkali insoluble polymer that is photoreactable in the presence of an azide sensitizer and include, as the sensitizer, a naphthalene compound having ortho diazo and oxo substituents and further having an azidosulfonyl substituent group wherein the sulfonyl moiety is bonded directly to the naphthalene nucleus.

Yet an additional object of this invention is to provide new light-sensitive compositions including a polymer and a sensitizer for the polymer.

Still another object of this invention is to provide novel positive-working photographic elements having a support coated with light-sensitive compositions including a polymer and a sensitizer for the polymer.

Yet an additional object of this invention is to provide new photographic processes for developing positive-working photographic elements having a support coated with light-sensitive compositions including a polymer and a sensitizer for the polymer.

Still other objects and advantages of the present invention will become increasingly apparent from a consideration of the following specification and appended claims.

The objects of this invention are accomplished with novel naphthalene compounds that are useful as sensitizers for certain polymers, these naphthalene sensitizers having ortho diazo and oxo substituents at the 1,2 or the 2,1 positions of the naphthalene nucleus and further having an azidosulfonyl substituent group wherein the sulfonyl moiety is bonded directly to the naphthalene nucleus at the 4 or 5 position. These objects are also accomplished with new light-sensitive compositions including a substantially alkali insoluble polymer that is photoreactable in the presence of an azide sensitizer and a sensitizing amount of a novel naphthalene sensitizer of the type described immediately hereinabove. In yet another aspect, these objects are accomplished with photographic elements including a support coated with a light-sensitive composition of this invention and with photographic processes for developing imagewise exposed photographic elements of the type presented elsewhere herein.

Naphthalene sensitizers of the present invention include diazoketones which are derivatives of 1,2-dihydronaphthalene and have azidosulfonyl groups wherein the azido moiety is linked (i.e., chemically bonded) directly or indirectly to the sulfonyl moiety which, in turn, is bonded directly to the 4- or 5-position of the naphthalene nucleus. The diazo group can be substituted at the 1-or 2-position of the naphthalene nucleus, and the oxo group is substituted at the other position. The term azidosulfonyl group as used herein includes such groups wherein the azido moiety and the sulfonyl moiety are separated by intervening chemical moieties.

Particularly useful azidosulfonyl groups of the comprehended types include those represented by the formulas:

$-SO_2N_3$ $-SO_2-O-Z-N_3$

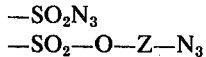

and

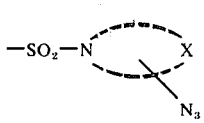

wherein:
a. Z represents a member selected from either an aryl radical or a heterocyclyl radical,
b. R³ represents a member selected from either a hydrogen atom or an alkyl radical, and
c. X represents the atoms necessary to complete a heterocyclyl radical including the nitrogen atom.

As used herein, the term alkyl radical refers to straight and branched chain alkyl radicals having from 1 to about 8 carbon atoms in the alkyl chain that determines the nomenclature for any particular alkyl radical. Exemplary such alkyl radicals include, for example, a methyl radical, an ethyl radical, a 2-haloethyl radical, a propyl radical, an isopropyl radical, an n-butyl radical, a 4-nitropentyl radical, a hexyl radical, a n-octyl radical, an isooctyl radical, and the like alkyl radicals. Lower alkyl radicals are those having from 1–4 carbon atoms. The term aryl radical refers to aromatized mono- or fused polycarbocyclic radicals, preferably having from 6 to 10 carbon atoms in the mono- or polycyclic nucleus. Included among the useful aryl radicals are such members as phenyl 2-chlorophenyl, p-tolyl, p-nitrophenyl, naphthyl, 5-nitronaphthyl, anthryl and the like substituted or unsubstituted aryl radicals. Further, the designation heterocyclyl radical refers to mono- or polycyclic radicals that can be either saturated or aromatized in some degree or fully, which radicals contain at least one hetero atom integral to at least one ring of the nucleus. Advantageous heterocyclyl radicals include those of the wide range of heterocyclic nuclei of the type used in the preparation of cyanine dyes. Such nuclei, including those of the many azole series like thiazole, benzothiazole, benzimidazole, etc., are described in detail, in the literature, for example in U.S. Pat. No. 3,384,486, especially from column 2, line 46 to column 3, line 33. It is specifically noted that alkyl, aryl and heterocyclyl radicals of the types described herein can be unsubstituted or substituted (in addition to the azido radical) with a variety of substituent groups including halogen atoms, radicals such as alkyl, nitro and the like.

Especially desirable naphthalene sensitizers of the present type include those having the formula:

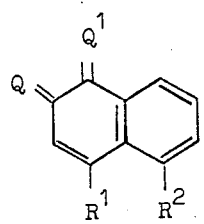

wherein:
a. Q and Q¹ are different and each represents a member selected from either a diazo radical or an oxo radical, and
b. R¹ and R² are different and each represents either a chemical substituent or an azido sulfonyl radical.

The term chemical substituent indicates a non-critical substituent group that is widely variable and can include such members as a hydrogen atom, a halogen atom, a nitro radical, an alkyl radical, an aryl radical or the like. In practice the potential range of chemical substituents is limited only in that substituents having a deleterious effect on the sensitizer should be avoided. Likewise, the remaining positions on the naphthalene nucleus, and particularly the 6,7 and 8-positions, can also be substituted with similar chemical substituents.

Especially preferred sensitizers include those having the formula

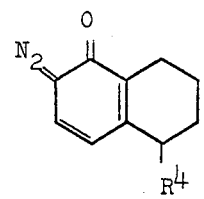

wherein R⁴ represents an azidosulfonyl group having a formula selected from
—SO₂N₃
—SO₂—O—Z—N₃

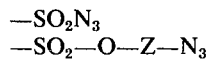

and

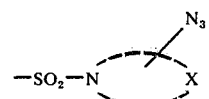

wherein each of Z, R³ and X are as defined elsewhere herein.

Particular advantageous sensitizers of the present type include such compounds as:
a. 2-diazo-1,2-dihydro-1-oxo-5(2'-azidophenoxysulfonyl) naphthalene,
b. 2-diazo-1,2-dihydro-1-oxo-5(4'-azidophenoxysulfonyl)naphthalene,
c. 2-diazo-1,2-dihydro-1-oxo-5(3'-azidophenoxysulfonyl)naphthalene,
d. 2-diazo-1,2-dihydro-1-oxo-5(4'-azido-2'-nitrophenoxysulfonyl)naphthalene,
e. 2-diazo-1,2-dihydro-1-oxo-5(5'-azidonaphthoxysulfonyl)naphthalene,
f. 1-azido-3,5-di(2'-diazo-1',2'-dihydro-1'-oxo-naphthalene-5-sulfonyloxy)benzene,
g. 2-diazo-1,2-dihydro-1-oxo-4(4'-azidophenoxysulfonyl)naphthalene,
h. 2-diazo-1,2-dihydro-1-oxo-5(2'-azidobenzimidazol-1'-ylsulfonyl)naphthalene,
i. 5-azidosulfonyl-2-diazo-1,2-dihydro-1-oxonaphthalene,
j. 2-diazo-1,2-dihydro-1-oxonaphthalene-5-N(4'-azidophenyl)sulfonamide,
k. 1-diazo-1,2-dihydro-2-oxo-5(2'-azidophenoxysulfonyl)naphthalene,
l. 2-diazo-1,2-dihydro-1-oxonaphthalene-5(N-methyl-N-4'-azidophenyl)sulfonamide,
m. 2-diazo-1,2-dihydro-1-oxo-4(2'-azidophenoxysulfonyl)naphthalene, and
n. 2-diazo-1,2-dihydro-1-oxo-4(3'-azidophenoxysulfonyl)naphthalene.

The diazoketone (quinone diazide), azidosulfonyl substituted naphthalene sensitizers described herein are conveniently prepared by reacting the appropriate 2,1- or 1,2-diazo-oxo-1,2-dihydronaphthalene having a sulfonyl halide substituent at the 4- or 5-position with an appropriate azido compound. The starting compound can be prepared by well known methods from the corresponding 2-amino-1-hydroxy or 1-amino-2-hydroxynaphthalene.

Suitable azido compounds for the cases where the azido sulfonyl group is as represented above by $R^4$ are as follows:
1. sodium azide,
2. a hydroxyaryl or hydroxyheterocyclic azide (by using a dihydroxy compound, it is possible to link together two 2-diazo-1-oxo-1,2-dihydronaphthalene nuclei by the azido group-containing substituent),
3. an amino (or substituted amino) aryl or heterocyclic amide (if desired, a diamino compound can be used to link two substituted naphthalene nuclei together), and
4. a heterocyclic compound having a hydrogen atom bonded to a nitrogen atom in a heterocyclic ring, this hydrogen atom being reactive enough to react with the sulphonyl halide group of the 2-diazo-1-oxo-1,2-dihydronaphthalene starting compound.

The reaction normally proceeds satisfactorily at room temperature and is conveniently carried out in a dioxane and water mixture. Specific illustrative preparations are described below.

As previously mentioned, the sensitizers described herein are useful in combination with substantially alkali insoluble polymers of the type that are photoreactable in the presence of an azide sensitizer. A wide variety of known polymers that are photoreactable with an azide sensitizer, for example the widely used cross-link promoting aryl azide sensitizers, are useful herein. The alkali solubility of any particular polymer can be readily determined by coating a thin (e.g., 0.004 inch wet thickness) layer of the polymer on a support member, drying the coated layer and contacting it with an alkaline bath such as 10% aqueous sodium triphosphate or the like. If the layer is not removed by the solvent after a reasonable time period, e.g., about 5 minutes, and is not deleteriously swollen thereby, than it can be regarded as substantially alkali insoluble for the purposes of this invention.

Useful polymer species include a wide range of organic solvent soluble polymers such as the natural and synthetic rubbers described in U.S. Pat. No. 2,852,379; the alkoxyalkylated polyamides described in U.S. Pat. No. 3,245,792; the polymers having peptide groups in side chains as described in Canadian Pat. No. 837,083; the polyesters and polycondensates described in Canadian Pat. No. 824,096, as well as a wide variety of other such organic solvent soluble polymers.

Particularly advantageous polymers include the unsaturated polyesters derived from polyols and unsaturated polycarboxylic acids as described in Canadian Pat. No. 824,096. Polyols which are advantageously employed in producing the polyesters utilized in this invention include both aliphatic and alicyclic polyols. Suitable aliphatic polyols can be, for example, such polyhydroxy compounds as lower alkane glycols having from 1 to 6 carbon atoms and homopolymers or copolymers of hydroxy substituted lower alkyl acrylate esters wherein the alkyl moiety has from 1 to 6 carbon atoms. Specific aliphatic polyols which exhibit particular utility in preparing the polyesters are, for example, ethylene glycol, 2,2-di(4-hydroxyethylphenyl)propane, neopentyl glycol, polyvinyl alcohol and poly or copoly acrylates wherein at least part of the acrylate is a hydroxyalkyl acrylate such as poly(hydroxyethylacrylate) and copoly(hydroxyethylacrylatemethylacrylate). Alicyclic polyols suitably employed in preparing the subject polyesters include cyclic alkanes having from 5 to 7 atoms in the carbocyclic nucleus, 1,4-dihydroxymethylcyclohexane for example, and polyhydroxy-containing carbohydrates such as cellulosic compounds including substituted cellulose derivatives of which hydroxypropyl cellulose is an example.

Unsaturated carboxylic acids which can be advantageously employed in forming the recited polyesters include compounds having the general formula:

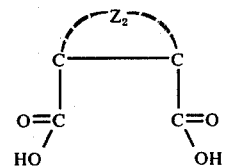

wherein $Z_2$ represents the atoms necessary to form an unsaturated bridged or unbridged carbocyclic nucleus typically having 6 to 7 carbon atoms. Such a carbocyclic nucleus can be substituted or unsubstituted. Particularly suitable acid units are 4-cyclohexene-1,2-dicarboxylic acid, 5-norbornene-2,3-dicarboxylic acid, hexachloro-5[2:2:1]bicycloheptene-2,3-dicarboxylic acid and the like.

Such unsaturated polycarboxylic acids readily polycondense with the above described polyols to form the polyesters useful in preparation of the present light-sensitive compositions. Mixtures of more than one polyol or more than one unsaturated polycarboxylic acid can be used. The subject polyesters are of two varieties, either essentially straight chain copolymers of a monomeric polyol and one of the unsaturated acids of this invention or polymers incorporating an initially polymeric polyol and the subject acid units as side chains. Particularly suitable polyesters include, for example, the esterification products of: polyvinyl alcohol and cis-4-cyclohexene-1,2-dicarboxylic acid; polyvinyl alcohol and 5-norbornene-1,2-dicarboxylic acid; cellulose and cis-4-cyclohexene-1,2-dicarboxylic acid; hydroxypropylcellulose and cis-4-cyclohexene-1,2-dicarboxylic acid; polyvinyl alcohol, benzoyl chloride and cis-4-cyclohexene-1,2-dicarboxylic acid; methyl acrylate/hydroxyethyl acrylate copolymer and cis-4-cyclohexene-1,2-dicarboxylic acid; the polycondensation product of ethylene glycol and cis-4-cyclohexene-1,2-dicarboxylic acid; and ethylene glycol, cis-4-cyclohexene-1,2-dicarboxylic acid and hexachloro-5-[2:2:1]bicycloheptene-2,3-dicarboxylic acid. Additionally, amounts of other acids, such as terephthalic acid, or acid salts or esters can be incorporated into the reaction mixture to obtain particular desired polymer or reaction characteristics.

Other especially useful polymers are alcohol-soluble polymers containing amide groups which are described in Canadian Pat. No. 837,083. Such polymers include homopolymers of recurring acryloylpeptide units having the formulas:

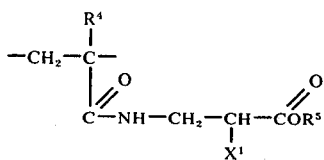

and

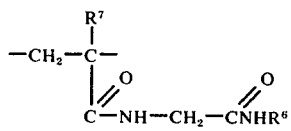

wherein $R^4$ and $R^7$ are each either a hydrogen atom or a lower alkyl radical, $R^5$ is a lower alkyl radical, $R^6$ is either a lower alkyl radical or a radical having the formula

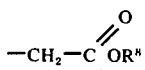

(wherein $R^8$ is a lower alkyl radical) and $X^1$ is

(wherein $R^9$ is a lower alkyl radical) or a lower alkyl radical or a hydrogen atom. These alcohol-soluble acryloylpeptide derivative polymers can also be copolymers of the above mentioned acryloylpeptide units with at least one recurring unit having the formulas:

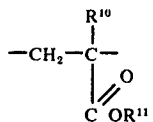

and

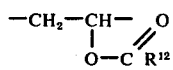

wherein $R^{10}$ is either a lower alkyl radical or a hydrogen atom, and both $R^{11}$ and $R^{12}$ are lower alkyl radicals. Such a copolymer is, for example, copoly(methylacrylate, N-acryloyl-N'-butylglycinamide). Additionally, mixtures of the polyesters and other polymers described herein, as well as still other polymers of the appropriate type, are advantageously used as the polymer component.

The above-described sensitizers and polymers can be combined to prepare light-sensitive compositions. Most preferably, these components are co-dissolved in a common solvent or in compatible miscible solvents so that the sensitizer is substantially uniformly dispersed within the polymer component. The choice of a particular solvent or solvent blend can vary between polymers, but an appropriate solvent can be determined conveniently by one skilled in the art. In the light-sensitive compositions, the concentration of sensitizer (i.e., the sensitizing amount) can be widely varied, with from about 5 percent by weight to about 40 percent by weight of the sensitizer to accompanying polymer being conventional practice. Wider variations can be used for particular situations. Most often the sensitizer concentration varies from about 10 to about 30 percent by weight.

The light-sensitive compositions described herein can be coated onto a support material preferably from a solvent, as a light-sensitive layer to prepare a composite photographic element useful as a photoresist or photolithographic master. The choice of a suitable coating solvent can be made readily, and the coating solvent can usually be the solvent used to prepare the light-sensitive composition.

Coating can be accomplished by any of the widely used means. Whirler coating, dipping, swabbing, hopper coating and doctor blade coating are examples of suitably employed techniques. In the coating solution, the total weight of sensitizer and polymer can also be widely varied, with about 2 percent by weight to over 30 weight percent of the final coating solution being illustrative. The particular percentage of solids in any given coating is dependent upon the use to which the photographic element will be applied. Coating thickness is also a function of intended use, and its limits are only those imposed by the concentration of the coating solution and the state of advancement attained by the coating art. Generally, however, coating thicknesses of between 1 mil. and 4 mils. are employed.

The choice of support upon which the sensitized polymer for positive-working systems is coated can be widely varied and is typically a function of that use to which the developed photographic element will be applied. Metal laminates, where a thin layer of a metal such as copper is bonded to a polymeric base material, are particularly suitable where subsequent etching is involved, such as in the production of printed circuits. Other useful support materials are described below.

When the coated positive-working photographic elements are exposed to light, including ultraviolet and actinic light, through an original pattern, the substantially alkali insoluble polymers are rendered suitably soluble (in the areas of exposure) in dilute alkaline solutions such as sodium and potassium hydroxide or trisodium phosphate. The mechanism of this reaction is not fully understood, but one explanation for the shift in solubility is a light-initiated reaction wherein the diazoketone configurations form solubilizing carboxylic acid groups on the sensitizers described herein, and the sensitizer is presumably photografted onto the polymer by means of the azido group through formation of a nitrene radical, thus attaching the solubilizing acid group to the polymer and imparting alkali solubility.

Development of the imagewise exposed positive-working photographic elements containing alkali soluble polymer in exposed regions is carried out with a dilute aqueous alkaline solution, such as those noted above, and which alkaline solution is susceptible of a wide variation in concentration. Typically, the alkaline developing solutions vary from about 1 to about 20 percent by weight of alkaline material to total solution, with the need for one concentration, rather than another, depending upon polymer concentrations, coating thickness and intensity of exposure. The concentration can be more extensively varied, however, in accordance with usual practices. Contacting the exposed element with developer solution causes the highly alkali soluble material in the exposed areas to dissolve away. This developing treatment can be accomplished by dipping, spraying, swabbing, and other techniques which permit the aqueous alkaline developer solvent to contact the exposed element for a period of time sufficient to selectively remove the alkali-soluble polymer in exposed regions.

After development, the element bears a polymer image which is a positive reproduction of the original pattern. This image is hydrophobic and ink receptive, and such developed photographic elements function advantageously in photomechanical reproduction operations, for example as masters for lithographic printing. They also function as resist stencils for etching operations and the like.

Support materials for all of the above described photographic elements can be metals, such as copper, aluminum, zinc and the like. They can also be conventional photographic film bases such as cellulose nitrate, polystyrene, cellulose acetate, cellulose acetate butyrate, poly(ethylene terephthalate), paper including polyethylene-coated and polypropylene-coated paper, and the like. Other support materials, e.g., glass, are well known in the art. Of course when the element is intended for use as a lithographic printing master, the support surface is desirably hydrophilic, either inherently or by virtue of its being modified by a surface treatment, i.e., as with grained aluminum, or application of a suitable hydrophilic subbing material prior to coating the light-sensitive layer. Numerous hydrophilic supports of the uncoated or precoated types are well known in the art of lithographic reproduction.

Additionally, a presensitized positive working lithographic plate, such as the photographic elements described herein, which gives a visible image immediately on exposure can be prepared by incorporating in the sensitive layer either a colorless substance which causes the layer to become colored on exposure, or a dye in which the color is altered or discharged upon exposure of the layer. The dye may be a fugitive one, or one in which the color is dependent on the pH of the surrounding medium. Colorless substances which can be used include:

1. leuco crystal violet,
2. leuco malachite green,
3. Michler's Hydrol,
4. 2-methylindole,
5. 2,5-dimethylindole,
6. 2-phenylindole, and
7. diphenylamine.

Dyes which can be used include:

8. 2-p-dimethylaminostyryl quinoline,
9. 1,1'-diethylisocyanine iodide, and
10. [1-methoxy-2-pyridine] [3-ethyl-2-benzthiazole] trimethine cyanine iodide.

The following illustrative examples are included for a further understanding of the invention.

EXAMPLE 1

Preparation of 2-diazo-1,2-dihydro-1-oxo-5-(4'-azidophenoxysulfonyl)naphthalene (Compound 1)

1,2-Dihydro-2-diazo-1-oxo-naphthalene-5-sulfonyl chloride (2.2 grams) is dissolved in dioxane (16 mls.) and the potassium salt of 4-hydroxyphenylazide (1.6 grams) in a mixture of water (4 ml.) and dioxane (4 ml.) is added gradually over a period of 10 minutes with stirring. The mixture is then stirred at room temperature (22°C) for 30 minutes to complete the reaction and then diluted with water (60 ml.) containing 3N hydrochloric acid (8 ml.). An oil separates out which solidifies on standing. The product is then collected and dried (2.5 grams). It is dissolved in benzene treated with carbon and filtered. Addition of 60°–80° pet. ether to the filtrate yields Compound 1. (1.7 grams) m.p. 136°–7° with decomposition.

EXAMPLE 2

Preparation of 2-Diazo-1,2-dihydro-1-oxo-5(2'-azidophenoxysulfonyl)naphthalene (Compound 2)

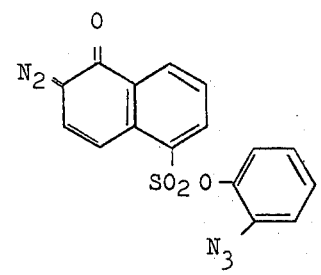

2-Diazo-1,2-dihydro-1-oxonaphthalene-5-sulphonyl-chloride (2.7 grams) is dissolved in dioxane (20 mls.) and 2-azidophenol (1.35 grams) is then added to the stirred solution at room temperature (22°C). The pH of the solution is adjusted to between 7 and 8 by the gradual addition of 10% sodium carbonate solution, and the resulting mixture is then stirred at room temperature (22°C) for 30 minutes. Addition of water (25 mls.) containing 3N hydrochloric acid (5 ml.), precipitated an oil which solidified on stirring. The product is collected, dried (3.2 grams) and dissolved in hot benzene. Addition of petroleum (pet.) ether (60°–80°C) yields Compound 2 as a pure material (2.1 grams), m.p. 132°–3°C (with decomposition).

EXAMPLE 3

Preparation of 2-Diazo-1,2-dihydro-1-oxo-5(3'-azidophenoxysulfonyl)naphthalene (Compound 3)

This compound is prepared in a similar manner to Compound 2 but 3-azidophenol is used instead of 2-azidophenol. Yield of Compound 3 is 2.3 grams, m.p. 129°–30°C (with decomposition).

EXAMPLE 4

Preparation of 2-Diazo-1,2-dihydro-1-oxo-5(4'-azido-2'-nitrophenoxysulfonyl)naphthalene (Compound 4)

This compound is prepared in a similar manner to compound 2 but 4-azido-2-nitrophenol (1.8 grams) is used instead of 2-azidophenol. Yield of Compound 4 as a pure material is 3.0 grams, 141°–2°C (with decomposition).

EXAMPLE 5

Preparation of 2-Diazo-1,2-dihydro-1-oxo-5(5'-azidonaphthoxysulfonyl)naphthalene (Compound 5)

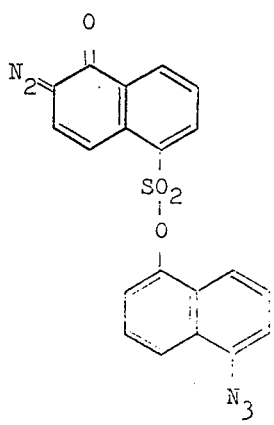

is prepared in a similar manner to Compound 2 but 5-azido-1-naphthol (1.85 grams) is used instead of 2-azidophenol. The product is recrystallized from methyl cellosolve, yielding 1.4 grams of Compound 5 as a pure product, m.p. 138°–9°C (with decomposition).

EXAMPLE 6

Preparation of
1-Azido-3,5-di(2'-diazo-1',2'-dihydro-1'-oxo-naphthalene-5'-sulphonyloxy)benzene (Compound 6)

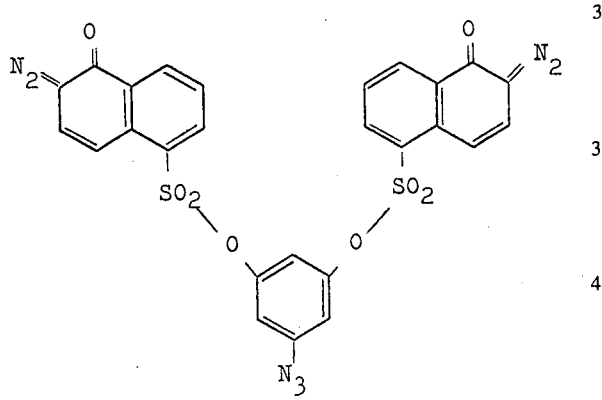

This compound is prepared in a similar manner to Compound 2 but 5-azidoresorcinol (0.75 gram) is used instead of 2-azidophenol. The crude product is then continually extracted overnight with ether to remove impurities and the residue is crystallized from benzene/petroleum ether. Yield of Compound 6 as pure product is 1.7 grams, m.p. 124°–5°C (with decomposition). Analysis indicated that 1 mole of Compound 6 contained half a mole of benzene of crystallization. Compound 6 without benzene of crystallization has m.p. 140°–2°C (with decomposition).

EXAMPLE 7

Preparation of
2-Diazo-1,2-dihydro-1-oxo-4(4'-azidophenoxysulfonyl)naphthalene (Compound 7)

This compound is prepared in a similar manner to Compound 1 but 2-diazo-1,2-dihydro-1-oxonaphthalene-4-sulfonyl chloride (2.2 grams) is used instead of the corresponding 5-sulfonyl chloride. The product is crystallized from ethanol. Yield of Compound 7 as a pure product is 1.1 gram, m.p. 131°–132°C (with decomposition).

EXAMPLE 8

Preparation of
2-Diazo-1,2-dihydro-1-oxo-5(2'-azidobenzimidazol-1'-yl-sulfonyl)naphthalene (Compound 8)

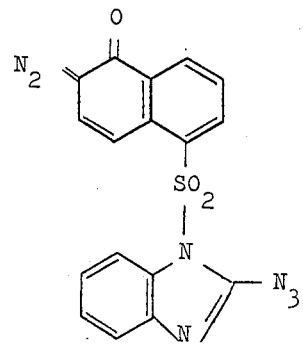

2-Azidobenzimidazole (1.6 grams) is dissolved in pyridine (6 ml.) and 2-diazo-1,2-dihydro-1-oxo-naphthalene-5-sulfonyl chloride (2.7 grams) is added gradually over 10 minutes with stirring, to the solution at room temperature (22°C). After addition, a further 6 mls. of pyridine is added and the solution is left overnight at room temperature. Addition of water (30 ml.) gives solid material which is then crystallized from toluene. Yield of Compound 8 as a pure product is 2.0 grams (decomposition point indefinite).

EXAMPLE 9

Preparation of
5-azidosulfonyl)-2-Diazo-1,2-dihydro-1-oxonaphthalene (Compound 9)

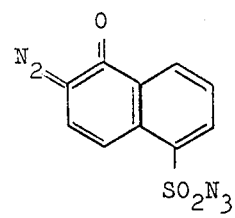

2-Diazo-1,2-dihydro-1-oxonaphthalene-5-sulphonyl-chloride (1.08 grams) is dissolved in dioxane (8 ml.) and a solution of sodium azide (0.27 gram) in water (1.5 ml.) is added over 5 minutes with stirring at room temperature (22°C). The mixture is stirred for a further 30 minutes and water added (10 ml.). The solid is then filtered off and washed with 50/50 dioxane, petroleum ether (60°–80°) mixture to give pure material. Yield of Compound 9 as pure product is 0.83 gram m.p. 146°C (with decomposition).

EXAMPLE 10

Preparation of
2-Diazo-1,2-dihydro-1-oxo-naphthalene-5-N-(4'-azidophenyl)sulphonamide (Compound 10)

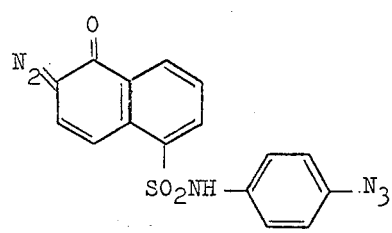

This compound is prepared in a similar manner to Compound 2 but 4-azidoaniline (1.34 grams) is used instead of 2-azidophenol. The product is then crystallized from a 50/50 dioxane/water mixture. Yield of Compound 10 as pure product is 2.9 grams m.p. 140° with decomposition.

EXAMPLE 11

Each of nine sheets (1–9) of anodized aluminum foil is coated on a whirler at 200 r.p.m. with the following solution:

| | |
|---|---|
| Mixed polyester of ethylene glycol and cis-4-cyclohexene-1,2-dicarboxylic anhydride and hexachloro-[2,2,1]-bicyclo-heptene dicarbocyclic anhydride | 0.7 gram |
| Copoly(methylacrylate, N-acryloyl-N'-butylglycinamide) in a molar ratio of 8:1 | 0.3 gram |
| Compound of the invention | 0.18 gram |
| Cyclohexanone | 12 ml. |

Each of the coated sheets includes the above recited, correspondingly numbered compound of the invention, i.e., compounds 1 through 9, in the stated amount. Each coated layer, after drying is exposed for 2 minutes through a positive line transparency to four 125 watt high pressure mercury vapour lamps placed at 18 inches from the exposing frame. Development is then carried out by immersion of the exposed layer in 10% aqueous trisodium phosphate for 1 minute, followed by a water rinse and light swab with cotton wool. During development the exposed areas are removed, thus leaving a positive image of the original.

Each positive image is strongly hydrophobic and readily inks up with a greasy lithographic printing ink.

EXAMPLE 12

A sheet of anodized aluminum foil is coated on a whirler at 200 r.p.m. with the following compositions:

| | |
|---|---|
| Polyester of ethylene glycol, 1,4-dihydroxymethyl cyclohexane and 5-norbornene-2,3-dicarboxylic anhydride | 0.7 gram |
| Copoly(methylacrylate, N-acryloyl-N'-butyl glycinamide) in a molar ratio of 8:1 | 0.3 gram |
| 2-Diazo-1,2-dihydro-1-oxo-5-(4-azido-phenoxysulfonyl)naphthalene | 0.18 gram |
| Cyclohexanone | 12 ml. |

After drying, the photographic element is exposed for 2 minutes through a positive original as in Example 11 and then developed by immersion in 10% trisodium phosphate solution followed by a water rinse and gentle swabbing. A positive image of the original is obtained which is readily inked up with a greasy lithographic printing ink.

EXAMPLE 13

A composite sheet of copper laminated to polyethylene terephthalate is whirler coated at 200 r.p.m. with a light-sensitive composition having the same formulation as Example 12.

After drying, the coating is exposed for 2 minutes through a line positive as in Example 11 and developed by immersion in 10% trisodium phosphate solution followed by a water rinse and gentle swabbing. A positive image is obtained which withstands 4 minutes spray etching with 30° Be ferric chloride with no degradation of the polymer.

EXAMPLE 14

A coating is prepared as described in Example 11, but using 0.06 gram of Compound 10. The resultant photographic element is exposed for 15 minutes through a positive original to four 125 watt high pressure mercury vapor lamps at 18 inches from the exposing frame. Development is then carried out by immersing the exposed layer in 10% aqueous trisodium phosphate for 10 seconds followed by a water rinse and light swabbing with cotton wool. A positive image is obtained which is readily inked up with a greasy lithographic printing ink.

EXAMPLE 15

A coating is prepared as described in Example 11, using Compound 1 as the sensitizer and also including the dye dimethylaminostyrylquinoline in the coating composition. On imagewise exposure of the dried coating, as described in Example 11, a visible image is obtained which can be processed as described in Example 11 to give a lithographic printing master of high quality.

Satisfactory visible images are also obtained upon exposure of elements similar to that of Example 15 in which the above dye is replaced by other dyes such as leuco crystal violet and [1-methoxy-2-pyridine] [3-ethyl-2-benzothiazole]trimethine cyanine iodide.

The invention has been described in detail with particular reference to certain preferred embodiments thereof, but it will be understood that variations and modifications can be effected within the spirit and scope of the invention.

We claim:

1. A light sensitive composition comprising a substantially alkali insoluble polymer that, in the presence of an azide sensitizer, is reactable on light irradiation and is rendered substantially alkali soluble by such reaction, and from about 5 to about 40% by weight based upon the weight of said polymer of a naphthalene sensitizer having the formula:

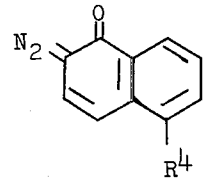

wherein $R^4$ represents an azidosulfonyl radical having a formula selected from the group consisting of:
—$SO_2N_3$
—$SO_2$—O—Z—$N_3$

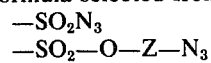

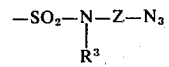

wherein:
a. Z is an aryl radical, and b. R³ represents a member selected from the group consisting of a hydrogen atom and an alkyl radical.

2. A light-sensitive composition comprising a substantially alkali insoluble polymer that, in the presence of an azide sensitizer, is reactable on light irradiation and is rendered substantially alkali soluble by such reaction, and a sensitizing amount of a naphthalene sensitizer selected from the group consisting of
   a. 2-diazo-1,2-dihydro-1-oxo-5(2'-azidophenoxysulfonyl)naphthalene
   b. 2-diazo-1,2-dihydro-1-oxo-5(4'-azidophenoxysulfonyl)naphthalene
   c. 2-diazo-1,2-dihydro-1-oxo-5(3'-azidophenoxysulfonyl)naphthalene
   d. 2-diazo-1,2-dihydro-1-oxo-5(4'-azido-2'-nitrophenoxysulfonyl)naphthalene
   e. 2-diazo-1,2-dihydro-1-oxo-5(5'-azidonaphthoxysulfonyl)naphthalene
   f. 1-azido-3,5-di(2'-diazo-1',2'-dihydro-1'-oxonaphthalene-5'-sulphonyloxy)benzene
   g. 2-diazo-1,2-dihydro-1-oxo-4(4'-azidophenoxysulfonyl)naphthalene
   h. 2-diazo-1,2-dihydro-1-oxo-5(2'-azidobenzimidazol-1'-ylsulfonyl)naphthalene
   i. 5-azidosulfonyl-2-diazo-1,2-dihydro-1-oxonaphthalene
   j. 2-diazo-1,2-dihydro-1-oxo-naphthalene-5-N-(4'-azidophenyl)sulphonamide.

3. A light-sensitive composition comprising
a. a polymer component including
   1. a mixed polyester of ethylene glycol, cis-4-cyclohexene-1,2-dicarboxylic anhydride and hexachloro-[2:2:1]-bicycloheptene-1,2-dicarboxylic anhydride, and
   2. copoly(methylacrylate/N-acryloyl-N'-butylglycinamide) and
b. a sensitizing amount of a compound selected from the group consisting of
   1. 2-diazo-1,2-dihydro-1-oxo-5(2'-azidophenoxysulfonyl)naphthalene
   2. 2-diazo-1,2-dihydro-1-oxo-5'(4'-azidophenoxysulfonyl)naphthalene
   3. 2-diazo-1,2-dihydro-1-oxo-5(3'-azidophenoxysulfonyl)naphthalene
   4. 2-diazo-1,2-dihydro-1-oxo-5(4'-azido-2'-nitrophenoxysulfonyl)naphthalene
   5. 2-diazo-1,2-dihydro-1-oxo-5(5'-azidonaphthoxysulfonyl)naphthalene
   6. 1-azido-3,5-di(2'-diazo-1',2'-dihydro-1'-oxonaphthalene-5'-sulphonyloxy)benzene
   7. 2-diazo-1,2-dihydro-1-oxo-4(4'-azidophenoxysulfonyl)naphthalene
   8. 2-diazo-1,2-dihydro-1-oxo-5(2'-azidobenzimidazol-1'-ylsulfonyl)naphthalene
   9. 5-azidosulfonyl-2-diazo-1,2-dihydro-1-oxonaphthalene
   10. 2-diazo-1,2-dihydro-1-oxo-naphthalene-5-N-(4'-azidophenyl)sulphonamide.

4. A light-sensitive composition comprising
a. a polymer component including
   1. a mixed polyester of ethylene glycol, 1,4-dihydroxymethylcyclohexane and 5-norbornene-2,3-dicarboxylic anhydride, and
   2. copoly(methylacrylate/N-acryloyl-N'-butylglycinamide) and
b. a sensitizing amount of a compound selected from the group consisting of
   1. 2-diazo-1,2-dihydro-1-oxo-5(2'-azidophenyloxysulfonyl)naphthalene
   2. 2-diazo-1,2-dihydro-1-oxo-5(4'-azidophenoxysulfonyl)naphthalene
   3. 2-diazo-1,2-dihydro-1-oxo-5(3'-azidophenoxysulfonyl)naphthalene
   4. 2-diazo-1,2-dihydro-1-oxo-5(4'-azido-2'-nitrophenoxysulfonyl)naphthalene
   5. 2-diazo-1,2-dihydro-1-oxo-5(5'-azidonaphthoxysulfonyl)naphthalene
   6. 1-azido-3,5-di(2'-diazo-1',2'-dihydro-1'-oxonaphthalene-5'-sulphonyloxy)benzene
   7. 2-diazo-1,2-dihydro-1-oxo-4(4'-azidophenoxysulfonyl)naphthalene
   8. 2-diazo-1,2-dihydro-1-oxo-5(2'-azidobenzimidazol-1'-ylsulfonyl)naphthalene
   9. 5-azidosulfonyl-2-diazo-1,2-dihydro-1-oxonaphthalene
   10. 2-diazo-1,2-dihydro-1-oxo-naphthalene-5-N-(4'-azidophenyl)sulphonamide.

5. A photographic element comprising a substantially alkali insoluble polymer that, in the presence of an azide sensitizer, is reactable on light irradiation and is rendered substantially alkali soluble by such reaction, and from about 5 to about 40% by weight based upon the weight of said polymer of a naphthalene sensitizer having the formula:

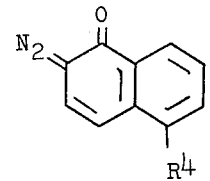

wherein R⁴ represents an azidosulfonyl radical having a formula selected from the group consisting of:
—SO₂N₃
—SO₂—O—Z—N₃

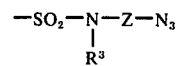

wherein:
a. Z is an aryl radical, and
b. R³ represents a member selected from the group consisting of a hydrogen atom and an alkyl radical.

6. A photographic element comprising a substantially alkali insoluble polymer that, in the presence of an azide sensitizer, is reactable on light irradiation and is rendered substantially alkali soluble by such reaction, and a sensitizing amount of a naphthalene sensitizer selected from the group consisting of:
   a. 2-diazo-1,2-dihydro-1-oxo-5(2'-azidophenoxysulfonyl)naphthalene
   b. 2-diazo-1,2-dihydro-1-oxo-5(4'-azidophenoxysulfonyl)naphthalene
   c. 2-diazo-1,2-dihydro-1-oxo-5(3'-azidophenoxysulfonyl)naphthalene
   d. 2-diazo-1,2-dihydro-1-oxo-5(4'-azido-2'-nitrophenoxysulfonyl)naphthalene
   e. 2-diazo-1,2-dihydro-1-oxo-5(5'-azidonaphthoxysulfonyl)naphthalene
   f. 1-azido-3,5-di(2'-diazo-1',2'-dihydro-1'-oxonaphthalene-5'-sulphonyloxy)benzene
   g. 2-diazo-1,2-dihydro-1-oxo-4(4'-azidophenoxysulfonyl)naphthalene
   h. 2-diazo-1,2-dihydro-1-oxo-5(2'-azidobenzimidazol-1'-ylsulfonyl)naphthalene
   i. 5-azidosulfonyl-2-diazo-1,2-dihydro-1-oxonaphthalene
   j. 2-diazo-1,2-dihydro-1-oxo-naphthalene-5-N-(4'-azidophenyl)sulphonamide.

* * * * *